(12) United States Patent
Iruvanti et al.

(10) Patent No.: US 7,816,785 B2
(45) Date of Patent: Oct. 19, 2010

(54) LOW COMPRESSIVE FORCE, NON-SILICONE, HIGH THERMAL CONDUCTING FORMULATION FOR THERMAL INTERFACE MATERIAL AND PACKAGE

(75) Inventors: Sushumna Iruvanti, Wappingers Falls, NY (US); Randall G. Kemink, Poughkeepsie, NY (US); Rajneesh Kumar, Poughkeepsie, NY (US); Steven P. Ostrander, Poughkeepsie, NY (US); Prabjit Singh, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 84 days.

(21) Appl. No.: 12/357,744

(22) Filed: Jan. 22, 2009

(65) Prior Publication Data

US 2010/0181663 A1      Jul. 22, 2010

(51) Int. Cl.
*H01L 23/10* (2006.01)
(52) U.S. Cl. .................... 257/707; 257/706
(58) Field of Classification Search .......... 257/706, 257/707, 718, 719
See application file for complete search history.

(56) References Cited

U.S. PATENT DOCUMENTS

| | | | |
|---|---|---|---|
| 3,885,984 A | 5/1975 | Wright | |
| 4,567,505 A | 1/1986 | Pease et al. | |
| 4,869,954 A | 9/1989 | Squitieri | |
| 5,098,609 A | 3/1992 | Iruvanti et al. | |
| 5,146,981 A | 9/1992 | Samarov | |
| 5,591,789 A | 1/1997 | Iruvanti et al. | |
| 5,738,936 A | 4/1998 | Hanrahan | |
| 5,783,862 A | 7/1998 | Deeney | |
| 5,890,915 A | 4/1999 | Reylek | |
| 5,904,796 A | 5/1999 | Freuler et al. | |
| 5,918,665 A | 7/1999 | Babcock et al. | |
| 6,377,453 B1 | 4/2002 | Belady | |
| 6,391,442 B1 | 5/2002 | Duvall et al. | |
| 6,496,373 B1 | 12/2002 | Chung | |
| 6,610,635 B2 | 8/2003 | Khatri | |
| 6,653,167 B2 | 11/2003 | Gektin | |
| 6,656,389 B2 | 12/2003 | Iruvanti et al. | |
| 6,780,927 B2 | 8/2004 | Ducros et al. | |
| 6,783,692 B2 * | 8/2004 | Bhagwagar | 252/70 |
| 6,791,839 B2 | 9/2004 | Bhagwagar | |
| 6,797,382 B2 | 9/2004 | Nguyen et al. | |
| 6,900,163 B2 | 5/2005 | Khatri | |
| 7,253,523 B2 | 8/2007 | Dani et al. | |
| 7,269,015 B2 | 9/2007 | Hornung et al. | |
| 7,459,782 B1 * | 12/2008 | Li | 257/702 |
| 7,476,568 B2 * | 1/2009 | Lu et al. | 438/113 |

(Continued)

FOREIGN PATENT DOCUMENTS

| | | |
|---|---|---|
| EP | 0 875 531 | 11/1998 |
| GB | 2 388 473 | 11/2003 |

(Continued)

*Primary Examiner*—S. V Clark
(74) *Attorney, Agent, or Firm*—Joseph Petrokaitis; Roberts Mlotkowski Safran & Cole, P.C.

(57) ABSTRACT

An improved thermal interface material for semiconductor devices is provided. More particularly, low compressive force, non-silicone, high thermal conductivity formulations for thermal interface material is provided. The thermal interface material comprises a composition of non-silicone organics exhibiting thermal conductivity of approximately 5.5 W/mK or greater and a compressed bond-line thickness of approximately 100 microns or less using a compressive force of approximately 100 psi or less.

10 Claims, 2 Drawing Sheets

U.S. PATENT DOCUMENTS

2006/0065974 A1 3/2006 Kumaus et al.
2007/0131055 A1 6/2007 Cheng et al.
2008/0017223 A1* 1/2008 Sachdev et al. ............... 134/26

FOREIGN PATENT DOCUMENTS

WO 02/067315 8/2002
WO 2007/130644 11/2007

* cited by examiner

LOW COMPRESSIVE FORCE, NON-SILICONE, HIGH THERMAL CONDUCTING FORMULATION FOR THERMAL INTERFACE MATERIAL AND PACKAGE

FIELD OF THE INVENTION

The present invention generally relates to improved thermal interface materials for semiconductor devices and, more particularly, to low compressive force, non-silicone, high thermal conductivity formulation for thermal interface material.

BACKGROUND OF THE INVENTION

Heat dissipation is a major factor in the design of semiconductor devices such as analog and power transistors and especially in high performance digital switching circuits formed at high integration density. It has become the practice to incorporate attachment of a heat sink or other heat removal structure (e.g. a liquid-cooled cold plate) into the design and manufacturing of integrated circuit packages since heat removal is critical to both performance and reliability of the integrated circuits.

For attachment of heat sinks to integrated circuit packages, it has been the practice to use an adhesive which has a relatively good thermal conductivity. However, the thermal conductivity of such materials is still very low compared to metals. For example, the thermal conductivity of a thermally conductive adhesive in current use is only approximately 1.73 W/m degree C.; whereas copper has a thermal conductivity of 395 W/m degree C.

It has been the practice to bond heat sinks to integrated circuit packages with a reworkable thermoplastic adhesive which is initially in the form of a sheet of a thickness designed to provide the proper volume and thickness of the bond. A dispensable formulation like paste or grease is an alternative to an adhesive preform.

A Thermal Interface Material (TIM) is most effective or can give lower thermal resistance if it has higher thermal conductivity and/or can be utilized at narrower bond-line thickness. TIMs generally have two major components, i.e., fillers, such as metal and/or non-metal particles and/or fibers, and a vehicle such as oil or short chain polymers (oligomers). The vehicle can be either silicone or a non-silicone based compound depending on the source, properties desired, application and cost of the paste. There could be additional components such as a dispersant, curing agent, antioxidants, etc.

Use of silicone oil based thermal interface materials (TIM) in microelectronics packaging could pose challenges with re-workability of parts, e.g., chips, substrates, lid and other hardware due to cross contamination by silicone oil from the TIM.

It is known that the thermal conductivity of a paste TIM can be increased by increasing the filler content in the paste formulation, which is the higher conducting ingredient of the two major components. But, as the filler content in the formulation is increased, the paste becomes more and more stiff or rigid and it becomes difficult to compress the paste to smaller bond-line thickness. Often, many TIMs incorporate a fugitive solvent in the mix, to achieve lower compressive force while trying to reach narrower bond-line thickness. It is often found that the fugitive solvent is a relatively volatile liquid that is difficult to contain for longer periods of time, and can reduce the shelf-life of the TIM.

Accordingly, there exists a need in the art to overcome the deficiencies and limitations described hereinabove.

SUMMARY

In aspects of the invention, a thermal interface material comprises a composition of non-silicone organics exhibiting thermal conductivity of approximately 5.5 W/mK or greater and a compressed bond-line thickness of approximately 100 microns or less using a compressive force of approximately 100 psi or less.

In embodiments, the composition comprises: a first ingredient having a Bulk Thermal Conductivity, W/mK, of greater than approximately 200, a particle size of approximately 10-20 microns and a weight percentage of approximately 30-42%; a second ingredient having Bulk Thermal Conductivity, W/mK, of greater than approximately 200, a particle size of approximately 3-10 microns and a weight percentage of approximately 18-24%; a third ingredient having a Bulk Thermal Conductivity, W/mK, of greater than approximately 5, a particle size of less than approximately 1.0 microns and a weight percentage of approximately 31-39%; and non-silicone organic vehicles, dispersants, and antioxidants, thickening agents and pigments. In further embodiments, the first and second ingredients are aluminum and the third ingredient is aluminum oxide. The composition comprises non-volatile solvents. The non-silicone organics have a weight percentage of approximately 7-10%. The non-silicone organics have a Bulk Thermal Conductivity, W/mK, of greater than approximately 0.01. The thermal conductivity is approximately 5.5 W/mK or greater. The compressed bond-line thickness is approximately 100 microns or less, with a compressive pressure of approximately 100 psi or less, respectively.

In accordance with further aspects of the invention, a thermal interface material comprises: a first aluminum ingredient having a particle size of approximately 10-20 microns and a weight percentage of approximately 30-42%; a second aluminum ingredient having particle size of approximately 3-10 microns and a weight percentage of approximately 18-24%; an aluminum oxide ingredient having a particle size of approximately less than 1.0 microns and a weight percentage of approximately 31-39%; and non-silicone organic vehicle, dispersants, antioxidants, thickening agents and pigments.

In further aspects of the invention, a structure thermal interface material located at an interface formed between a hat/lid and heat-sink. The hat/lid is placed over single or plurality of chips, which are mounted on a substrate. The thermal interface material comprises a composition of non-silicone organics and non-volatile solvents exhibiting thermal conductivity of approximately 5.5 W/mK or greater and compressed bond-line thickness of approximately 200 microns or less using a compressive force of 100 psi or less.

In embodiments, the composition comprises: a first ingredient having a Bulk Thermal Conductivity, W/mK, of greater than approximately 200, a particle size of approximately 10-20 microns and a weight percentage of approximately 30-42%; a second ingredient having Bulk Thermal Conductivity, W/mK, of greater than approximately 200, a particle size of approximately 3-10 microns and a weight percentage of approximately 18-24%; a third ingredient having a Bulk Thermal Conductivity, W/mK, of greater than approximately 5, a particle size of less than 1.0 microns and a weight percentage of 3 approximately 1-39%; and non-silicone organic vehicle dispersants, antioxidants, thickening agents and pigments. In further embodiments, the composition comprises: a first aluminum ingredient having a particle size of approximately 10-20 microns and a weight percentage of approximately 30-42%; a second aluminum ingredient having particle size of approximately 3-10 microns and a weight percentage of approximately 18-24%; an aluminum oxide ingredient having a particle size of less than approximately 1.0 micron and a weight percentage of approximately 31-39%; and non-silicone organic vehicle dispersants, antioxidants, thickening agents and pigments.

In further aspects of the invention, a structure comprises: a substrate; a single or plurality of chips on the substrate; a hat/lid placed over the plurality of chips; a heat-sink over the hat/lid forming an interface between the had/lid and the heat sink; and an interface material at the interface in contact with a surface of the heat-sink and the hat/lid. The thermal interface material comprises a composition of non-silicone organics exhibiting thermal conductivity of approximately 6.0 W/mK or greater and compressed bond-line thickness of approximately 200 microns or less using a compressive force of 100 psi or less.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
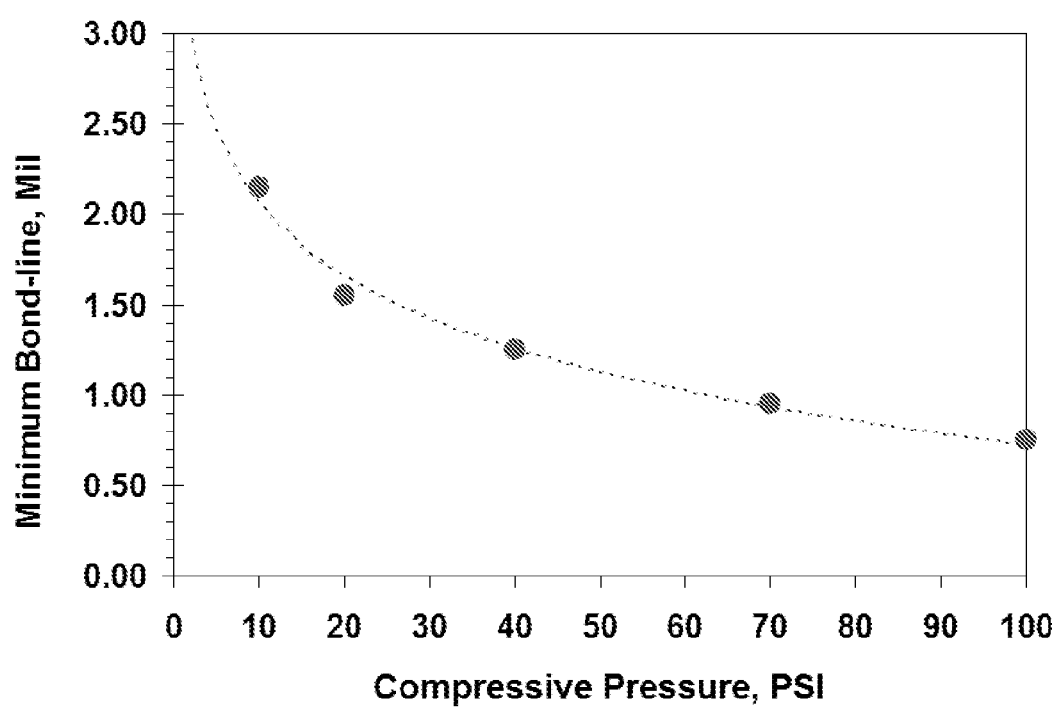
FIG. 1 shows a graph plotting the properties of the thermal interface material of the present invention.

The present invention generally relates to improved interface materials for semiconductor devices and, more particularly, to low compressive force, non-silicone, high thermal conducting formulation interface material. In implementation, the present invention provides a structure to improve thermal performance, reliability and ease of field rework/repair of devices and/or components with large uneven thermal interfaces. In embodiments, the invention includes thermal interface material that can be located between large thermal interfaces. The thermal interface material has the ability to evenly fill uneven gaps at low compressive force, and also has easy re-workability. In more specific embodiments, the thermal interface material is non-silicone, non-solvent based, which exhibits a high thermal conductivity and longer shelf-life in the field than conventional pastes or materials.

Advantageously, the use of a non-silicone based thermal interface material of the present invention avoids the risk of impacting functionality or component rework and/or by cross-contamination due to silicone migration and contamination of interconnects (e.g., land grid array (LGA) pads and other active devices). Moreover, the thermal solution of the present invention has low volatility and does not dry-out when stored by field engineers.

More specifically, the invention is directed to a thermal interface material formulation that provides high thermal conductivity (thermal conductivity of approximately 5.5 W/mK or greater) paste/grease, and, at the same time, can be compressed to narrower bond-line thickness (BLT) of approximately 100 micron or less and preferably 75 micron and more preferably 18-55 microns, with a compressive pressure of 10 psi or less, or preferably 20 psi or less and more preferably 100 psi or less, respectively. For example, with a 10 psi or less it is possible to obtain a bond-line thickness (BLT) of approximately 100 microns. In further implementations, the thermal conductivity is above 5.5 W/mK with the above desired bond line thickness within the preferred ranges of compressive forces.

In embodiments, the formulation of the thermal interface material includes aluminum within a first particle size range, aluminum within a second particle size range and aluminum oxide. Other non-silicone organics are also contemplated by the present invention for use as a vehicle, disperstants, antioxidants, thickening agents, pigments and the like. More specifically, Table 1 shows a formulation of the thermal interface material of the present invention.

TABLE 1

| Material | Bulk Thermal Conductivity, W/mK | Particle Size/Type | Wt % |
| --- | --- | --- | --- |
| Ingredient A | Approx. >200 | Approx. 10-20 microns | 30-42 |
| Ingredient B | Approx. >200 | Approx. 3-10 microns | 18-24 |
| Ingredient C | Approx. >5 | less than 1.0 microns (and more preferably approximately 0.1 to 1.0 micron) | 31-39 |
| Non-Silicone Organics | Approx. >0.01 | Vehicle dispersants, antioxidants, thickening agents, pigments, and the like | 7-10 |

The formulation shown above advantageously provides a high thermal conductivity (thermal conductivity of approximately 6 W/mK) with a compressed narrower bond-line thickness of approximately 75 micron or less and more preferably 55-18 microns, with a compressive pressure of 10-100 psi, respectively. The formulation above preferably provides a low compressive force to reach a thin bond-line thickness of less than 3 mil. (e.g., approximately 75 microns), with no high temperature in application for cure or phase change, while using non-silicone materials and no volatile solvents.

More specifically, Table 2 shows a formulation of the thermal interface material of the present invention.

TABLE 2

| Material | Particle Size/Type | Wt % |
| --- | --- | --- |
| Aluminum A | Approx. 10-20 microns | 30-42 |
| Aluminum B | Approx. 3-10 microns | 18-24 |
| Aluminum Oxide | less than 1.0 microns (and more preferably approximately 0.1 to 1.0 micron) | 31-39 |
| Non-Silicone Organics | Vehicle dispersants, antioxidants, thickening agents, pigments, and the like | 7-10 |

Additional non-limiting examples are provided in Table 3, below, in order to provide further illustration of the different combinations contemplated by the invention. Those of skill in the art will understand, though, that the examples of Table 3 are provided for illustrative purposes and should not be considered a limiting feature of the claimed invention. The thermal conductivity measurements have an accuracy of approximately ±5.0%, the weigh percentage and the particle size have an accuracy of ±1.0%.

TABLE 3

| Material | Particle Size/Type | A | B | C |
|---|---|---|---|---|
| Aluminum A | Approx. 10-20 microns | 29-32 | 40-42 | 40-42 |
| Aluminum B | Approx. 3-10 microns | 22-25 | 17-20 | 17-20 |
| Aluminum Oxide | less than 1.0 micron (and more preferably approximately 0.1 to 1.0 micron) | 37-40 | 30-33 | 30-33 |
| Non-Silicone Organics | Vehicle dispersants, antioxidants, thickening agents, pigments, and the like | 7.4-7.8 | 8.5-8.9 | 9.0-9.4 |
| Thermal Conductivity (TC) W/mK | | 6.1 | 6.9 | 5.9 |
| Compressive Pressure to reach 75 micron BLT | | 75 | 10 | 10 |

TABLE 4

| Material | Particle Size/Type | X | Y |
|---|---|---|---|
| Aluminum A | 10-20 microns | 41-44 | 39-42 |
| Aluminum B | 3-10 microns | 23-26 | 17-19 |
| Aluminum Oxide | less than 1.0 micron | 23-26 | 29-32 |
| Non-Silicone Organics | Vehicle, dispersants, antioxidants, thickening agents, pigments, and the like | 7.8-8.2 | 10.6-11.0 |
| Thermal Conductivity (TC) W/mK | | 7.6 | 5.0 |
| Compressive Pressure (psi) to reach 75 micron BLT | | 135 | 60 |

As shown in the example of "X" in Table 4, the TC of greater than 7.0 W/mK is an acceptable thermal conductivity, but the 136 psi of compressive pressure is far outside the acceptable range. Also, in the example of "Y" in Table 3, the TC of 5.0 W/mK is outside the acceptable range but the 60 psi compressive pressure is within the acceptable range. Thus, as shown, when formulation of the thermal interface material is made outside of the limits of the present invention, the thermal interface material can either have thermal conductivity lower than 5.5 W/mK and/or compressive pressure greater than 100 psi to reach a 75 micron bond line thickness. The thermal conductivity measurements have an accuracy of approximately ±5.0%, the weigh percentage and the particle size have an accuracy of ±1.0%.

FIG. 1 shows a graph plotting the properties of the thermal interface material of the present invention. For example, the graph of FIG. 1 shows that the thermal interface material of the present invention can be compressed with compressive pressure of 10 psi to 100 psi to reach minimum bond-line thickness of 18 microns to 55 microns, respectively. More specifically, the graph of FIG. 1 shows that the thermal interface material of the present invention has a thermal conductivity 6.0 W/mK and can be compressed to gaps of 0.75-3.00 mil at a pressure of 100-2 psi, respectively.

Figure 2:
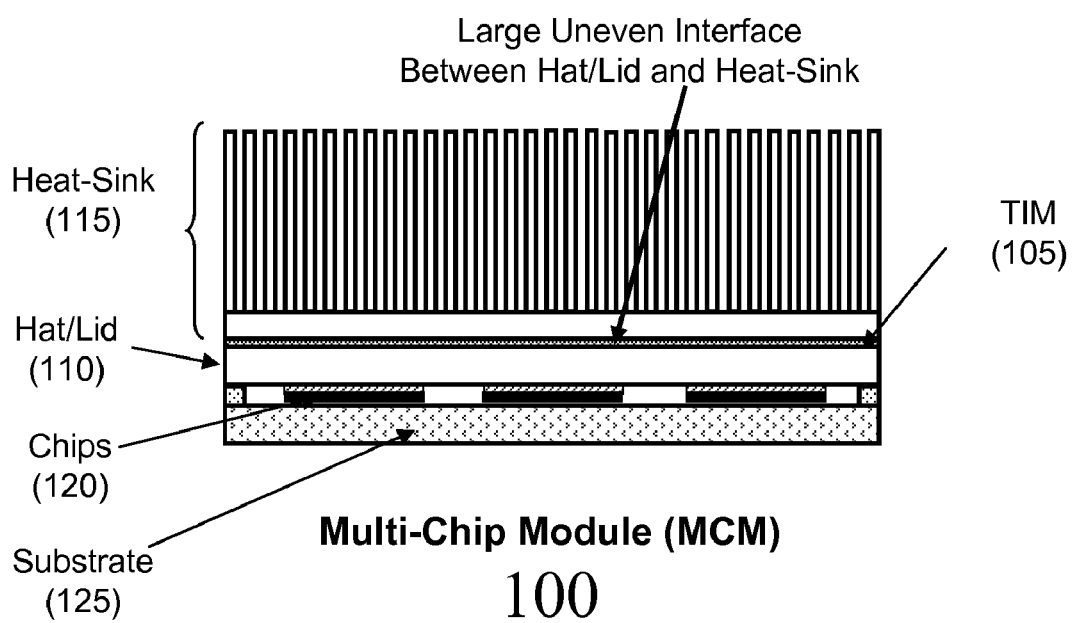
FIG. 2 shows a structure having thermal interface material of the present invention.

FIG. 2 shows a structure using the thermal interface material of the present invention. More specifically, FIG. 2 shows a structure (multi-chip module) 100 with an improved thermal performance, reliability and re-workability using the thermal interface material 105 of the present invention at a large and uneven thermal interface. The thermal interface material 105 is between a hat/lid 110 and heat sink 115 of the structure (multi-chip module) 100. The hat 110 is placed over a plurality of chips 120 which are mounted on a substrate 125. In embodiments, the contact area between the heat-sink 115 and hat/lid 110 is approximately 138 mm×138 mm and the thermal interface material 105, in embodiments, can fully cover the center area of 105 mm×105 mm; although other dimensions are contemplated by the present invention. The thermal interface material 105 preferably remains within, i.e., not squeezed out, the perimeter of the structure (multi-chip module) 100 and more particularly remains within the boundaries of the interface in contact with a surface of the hat/lid 110 and the heat sink 115. In embodiments, the interface surfaces are bare copper or Ni plated copper.

Advantageously, the thermal interface material 105 does not migrate and contaminate to other hardware. Also, the thermal interface material 105 provides high-performance across the thermal interface, with a narrow spread/distribution of performance across the thermal resistance. Additionally, the thermal interface material 105 can evenly fill uneven gap and can withstand the open-ambient field-use, as well as meet the shelf-life requirements.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A structure comprising thermal interface material located at an interface formed between a hat/lid and heat-sink, the hat/lid being placed over a single chip or plurality of chips which are mounted on a substrate, the thermal interface material comprising a composition of non-silicone organics and non-volatile solvents exhibiting thermal conductivity of approximately 5.5 W/mK or greater and compressed bond-line thickness of approximately 200 microns or less using a compressive force of approximately 100 psi or less.

2. The structure of claim 1, wherein the composition comprises:
   a first ingredient having a Bulk Thermal Conductivity, W/mK, of greater than approximately 200, a particle size of approximately 10-20 microns and a weight percentage of approximately 30-42%;
   a second ingredient having Bulk Thermal Conductivity, W/mK, of greater than approximately 200, a particle size of approximately 3-10 microns and a weight percentage of approximately 18-24%;
   a third ingredient having a Bulk Thermal Conductivity, W/mK, of greater than approximately 5, a particle size of approximately less than 1.0 micron and a weight percentage of approximately 31-39%; and
   non-silicone organic vehicle, dispersants, antioxidants, thickening agents and pigments.

3. The structure of claim 1, wherein the composition comprises:
   a first aluminum ingredient having a particle size of approximately 10-20 microns and a weight percentage of approximately 30-42%;
   a second aluminum ingredient having particle size of approximately 3-10 microns and a weight percentage of approximately 18-24%;
   an aluminum oxide ingredient having a particle size of less than approximately 1.0 microns and a weight percentage of approximately 31-39%; and
   non-silicone organic vehicle dispersants, antioxidants, thickening agents and pigments.

4. The structure of claim 1, wherein the thermal conductivity is approximately 6.0 W/mK or greater.

5. The structure of claim 1, wherein the composition comprises non-volatile solvents.

6. A structure comprising:
   a substrate;
   a single or plurality of chips on the substrate;
   a hat/lid placed over the single or plurality of chips;
   a heat-sink over the hat/lid forming an interface between the had/lid and the heat sink; and
   an interface material at the interface in contact with a surface of the heat-sink and the hat/lid, the thermal interface material comprising a composition of non-silicone organics exhibiting thermal conductivity of approximately 6.0 W/mK or greater and compressed bond-line thickness of approximately 200 microns or less using a compressive force of approximately 100 psi or less.

7. The structure of claim 6, wherein the composition comprises:
   a first ingredient having a Bulk Thermal Conductivity, W/mK, of greater than approximately 200, a particle size of approximately 10-20 microns and a weight percentage of approximately 30-42%;
   a second ingredient having Bulk Thermal Conductivity, W/mK, of greater than approximately 200, a particle size of approximately 3-10 microns and a weight percentage of approximately 18-24%; and
   a third ingredient having a Bulk Thermal Conductivity, W/mK, of greater than approximately 5, a particle size of approximately less than 1.0 micron and a weight percentage of approximately 31-39%.

8. The structure of claim 6, wherein the composition comprises:
   a first aluminum ingredient having a particle size of approximately 10-20 microns and a weight percentage of approximately 30-42%;
   a second aluminum ingredient having particle size of approximately 3-10 microns and a weight percentage of approximately 18-24%; and
   an aluminum oxide ingredient having a particle size of less than approximately 1.0 microns and a weight percentage of approximately 31-39%.

9. The structure of claim 6, wherein the compressed bond-line thickness is approximately 55-18 microns.

10. The structure of claim 6, wherein the interface surfaces are bare copper or Ni plated copper.